United States Patent
Cazaux et al.

(10) Patent No.: US 7,417,268 B2
(45) Date of Patent: Aug. 26, 2008

(54) IMAGE SENSOR

(75) Inventors: Yvon Cazaux, Grenoble (FR); Didier Herault, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/490,308

(22) Filed: Jul. 20, 2006

(65) Prior Publication Data

US 2007/0018075 A1 Jan. 25, 2007

(30) Foreign Application Priority Data

Jul. 21, 2005 (FR) .................................. 05 52260

(51) Int. Cl.
*H01L 27/148* (2006.01)
(52) U.S. Cl. ...................... 257/225; 257/184; 257/187; 257/258; 257/E31.058
(58) Field of Classification Search ................ 257/184, 257/186, 187, 192, 201, 222, 226, 291, 461, 257/509, 927, 225, 258
See application file for complete search history.

(56) References Cited

U.S. PATENT DOCUMENTS 5,254,868 A * 10/1993 Saito .......................... 257/432

2004/0238911 A1 12/2004 Francois

FOREIGN PATENT DOCUMENTS

EP 1 387 397 A2 2/2004

OTHER PUBLICATIONS

French Search Report from French Patent Application 05/52260, filed Jul. 21, 2005.
Patent Abstracts of Japan vol. 2002, No. 04, Aug. 4, 2002 & JP 2001 339057 A (Koyanagi Mitsumasa; Fuji Xerox Co., Ltd.), Dec. 7, 2001.
Kurino H. et al. "Intelligent image snesor chip with three dimensional structure" Electron Devices Meeting, 1999. IEDM Technical Digest, International Washington, DC, USA Dec. 5-8, 1999, Piscataway, NJ, USA, IEEE, US, Dec. 5, 1999, pp. 879-882, XP010372201 ISBN: 0-7803-5410-9.

* cited by examiner

*Primary Examiner*—Wai-Sing Louie
(74) *Attorney, Agent, or Firm*—Lisa K. Jorgenson; William R. McClellan; Wolf, Greenfield & Sacks, P.C.

(57) ABSTRACT

An image sensor including a pixel assembly, each pixel including a photodiode and an access transistor connected to a read circuit, the photodiode and the access transistor being formed in and above a first semiconductor substrate, all or part of the read circuit being formed in a second semiconductor substrate, the second substrate being placed above the first substrate and separated therefrom by an intermediary insulating layer covering the access transistor, the photodiode receiving incident photons on its lower surface side opposite to the intermediary insulating layer.

18 Claims, 2 Drawing Sheets

IMAGE SENSOR

BACKGROUND OF THE INVENTION

1. Field of the Invention

The present invention relates to an image sensor formed of a pixel assembly, each pixel comprising a photodiode.

2. Discussion of the Related Art

FIG. 1 is a diagram of a pixel of an image sensor of "4 transistors" type. The pixel comprises a photodiode 1, an access transistor 2, and a read circuit 3. The anode of the photodiode is grounded. The cathode of photodiode 1 is connected to a row line RL. The drain of access transistor 2 is connected to the source of access transistor 2. The gate of access transistor 2 is connected to a node n. Read circuit 3 is formed of three N-channel MOS transistors T1, T2, T3. The source of transistor T1 and the gate of transistor T2 are connected to node n. The drains of transistors T1 and T2 are connected to a supply voltage Vdd. Transistor T1 is controlled by a reset signal Reset. The source of transistor T2 is connected to the drain of transistor T3 which is controlled by a read signal Read. The source of transistor T3 is connected to a column line Col.

Conventionally, photodiode 1, access transistor 2, and transistors T1, T2, and T3 are formed next to one another in and above a semiconductor substrate, for example, P-type doped. The photodiode comprises P and N doped area formed in the substrate, the P and N areas forming a P/N junction. The transistors are connected to one another as well as to supply voltage Vdd and to column and row lines Col and RL via metallizations formed above the semiconductor substrate in openings of an insulating layer covering the substrate and the transistor gates.

For each pixel, photodiode 1 forms the incident photon capture area. The incident photons cross the insulating layer covering the substrate before they reaching said substrate. On arrival of a photon at the level of photodiode 1, electron-hole pairs are generated. The holes head towards the ground by creating a current through the substrate, and the electrons are "accumulated" in the N-type area of the photodiode which forms a storage "well".

Conventionally, the pixels of the image sensor are arranged in the shape of a matrix formed of an assembly of rows and columns. The gates of the pixels of the same column are connected to the same column line Col. The access transistors of the pixels of the same row are connected to the same row line RL. The pixels of the image sensor are read row by row in cyclic fashion. Prior to any reading, the reset signal is activated to turn on transistor T1 of each pixel to charge node n to a voltage close to supply voltage Vdd. When a pixel row is read, the read signal is activated to turn on transistors T3 of the pixels of this row. A differential read device then performs for each column a sampling of the voltage present on column line Col, this voltage corresponding to voltage Vn at node n, neglecting an offset. The read pixel row line is then activated to turn on the access transistors of the pixels of this row. For each pixel, the electrons stored in the photodiode head for node n, which results in lowering voltage Vn of node n. The differential read device then performs a second sampling of the voltage present on column line Col. The sampled voltage is all the lower as voltage Vn is low, that is, as the detected light intensity is high. The differential read device then calculates the difference between the first and second sampled voltages, which provides a voltage directly proportional to the number of captured photons per photodiode. Once the reading of a row is over, the selected row line and the read signal are deactivated. The reset signal is then activated again. This sequence of operations is cyclically repeated for each row of the image sensor.

The light intensities measured with this type of "4-transistor" pixel are of good quality. However, when the pixel size is desired to be decreased to increase the number of pixels on a given surface, the sizes of access transistor 2 and of transistors T1 to T3 cannot be sufficiently decreased, to keep a sufficient variation range of the voltage at node n, and the surface area decrease of the pixels is performed to the detriment of the surface taken up by the photodiode. This results in significantly decreasing the sensitivity of the image sensor pixels.

To keep a correct sensitivity while decreasing the pixel size various pixel structures have been devised.

In an image sensor comprising pixels, each comprising an access transistor such as previously described, it is possible to put the read circuits in common. A read circuit is then shared by two pixels. Such a putting in common enables reducing the relative surface area of the transistors with respect to that of the photodiodes. However, such an image sensor requires a slightly more complex addressing circuit. This provides a gain in surface area but this gain remains insufficient for the smallest pixels.

FIG. 2 is an equivalent electric diagram of a pixel of "three-transistor" type which comprises no access transistor. Each pixel comprises a photodiode 30 having its anode connected to ground and its cathode connected to a node n. Node n is connected to a read circuit identical to that of the pixel shown in FIG. 1, the read circuit comprising three transistors T1, T2, and T3.

After each reading of a pixel row, the reset signal connected to transistors T1 of these pixels is activated for a short time to position their node n at a precharge voltage close to that of supply voltage Vdd. The voltage at node n of each pixel then progressively decreases, according to the detected light intensity, until the pixels of this row are read again via transistors T2 and T3.

For a given surface area of a pixel of 3-transistor type, the surface area taken up by the photodiode can be increased with respect to a "4-transistor" pixel shown in FIG. 1. However, the measurements performed by such pixels contain much more noise than those performed by 4-transistor pixels. The measurement noise is proportional to kTC, where k is the Boltzmann constant, T the temperature, and C the equivalent capacitance of the reverse photodiode. Such noise is due to the fact that the precharge of "capacitive" node n is performed through the source/drain resistor of transistor T1. Since a sampling of the precharge voltage of node n cannot be performed prior to the progressive discharge of node n according to the captured photons, the differential reading does not enable suppressing this kTC noise, conversely to the reading of a 4-transistor type pixel.

FIG. 3 is a cross-section view of a "compact" 3-transistor type pixel. The equivalent electric diagram of this pixel is that shown in FIG. 2. Read transistors T1, T2, and T3 are formed in and above a P-type doped substrate 40. In this partial view, only transistor T1 is shown. Transistor T1 comprises a gate 41 insulated from substrate 40 by a thin oxide layer 42 and source/drain areas 43 and 44 placed on each side of gate 41. Substrate 40 and transistors T1, T2, and T3 are covered with an insulating layer 45, itself covered with an amorphous silicon layer 46 in which are formed the photodiodes of the pixels. The upper portion of silicon layer 46 is P-type doped. The rest of the layer is substantially undoped, or intrinsic I, except in lower N-type doped areas. Each pixel comprises a lower N area 47 connected to a source/drain area 43 of transistor T1 of this pixel via a metallization 48 placed in a through opening of insulating layer 45. For each pixel, a filter portion 49 is placed above the amorphous silicon layer. The filter portions let through incident photons exhibiting wavelengths within predefined ranges generally corresponding to those of blue, green, and red.

This pixel structure provides a very large photodiode surface area and thus pixels exhibiting a good sensitivity. However, in addition to the above-mentioned disadvantages relative to 3-transistor pixels, the forming of PIN-type photodiodes in amorphous silicon has many disadvantages, and especially a premature aging of layer 46 in the presence of intense light.

SUMMARY OF THE INVENTION

An object of the present invention is to provide an image sensor having "compact" pixels exhibiting a very good sensitivity, enabling performing light intensity measurements of good quality, which are reliable with time.

Another object of the present invention is to provide such an image sensor of simple structure.

To achieve these and other objects, the present invention provides an image sensor comprising a pixel assembly, each pixel comprising a photodiode and an access transistor connected to a read circuit, the photodiode and the access transistor being formed in and above a first semiconductor substrate, all or part of the read circuit being formed in a second semiconductor substrate, the second substrate being placed above the first substrate and separated therefrom by an intermediary insulating layer covering the access transistor, the photodiode receiving incident photons arriving in the first semiconductor substrate on its lower surface side opposite to said intermediary insulating layer.

According to a variation of the previously-described sensor, the access transistor comprises an insulated gate, the photodiode comprises a heavily-doped P-type upper area placed at the surface of the first P-type substrate and an N-type buried layer placed under said upper area, said buried area extending in a source/drain area of the access transistor, and another source/drain area of the access transistor being placed on the other side of its gate at the surface of the first substrate, the heavily-doped P-type upper area being connected to a bias voltage such as the ground via, among others, a metallization placed in the intermediary insulating layer above the heavily-doped P-type upper area.

According to a variation of the above-mentioned sensor, the read circuit comprises read transistors formed on the upper surface side of the second substrate, the second substrate and the read transistors being covered with an upper insulating layer, a metallization, connecting the access transistor and the read circuit, being placed partly in openings of the intermediary insulating layer, partly in openings insulated from the second substrate, and partly in openings of the upper insulating layer.

According to a variation of the above-mentioned sensor, the read circuit comprises transistors formed on the lower surface side of the second substrate, the read transistors being covered with said intermediary insulating layer, a metallization, connecting the access transistor and the read circuit, being placed in said intermediary insulating layer.

According to a variation of the above-mentioned sensor, the sensor comprises for each pixel a filter portion placed against the lower surface of the first surface.

According to a variation of the above-mentioned sensor, the filter comprises, for each pixel, a lens placed against the filter portion.

According to a variation of the above-mentioned sensor, a heavily-doped P-type area is formed at the surface of the first substrate on its lower surface side.

According to a variation of the previously-described sensor, the thickness and the doping of the buried layer of the photodiode are such that without any photon capture, the buried area is entirely depleted.

According to a variation of the above-mentioned sensor, the sensor comprises a control circuit having its semiconductor components formed in the first semiconductor substrate.

The present invention further provides a method for forming an image sensor comprising: forming photodiodes and access transistors in and above a first semiconductor substrate; covering the first substrate and the access transistors with an intermediary insulating layer; forming, by deposition, a second semiconductor substrate above the intermediary insulating layer; forming read transistors in and above the second substrate; covering the second substrate and the read transistors with an upper insulating layer; and forming metallizations in openings of the upper insulating layer, of the second substrate, and of the intermediary insulating layer to connect the access transistors to the read transistor.

The present invention further provides another method for manufacturing an image sensor comprising: forming photodiodes and access transistors in a first semiconductor substrate; covering the first substrate with a first insulating layer; forming read transistors in and above a second substrate; covering the second substrate with a second insulating layer; forming metallization portions in openings of first and second insulating layers; and gluing said first and second insulating layers to form a single intermediary insulating layer separating the first and second substrates, the contiguous metallization portions forming metallizations connecting the access transistors to the read transistors.

The foregoing objects, features, and advantages of the present invention will be discussed in detail in the following non-limiting description of specific embodiments in connection with the accompanying drawings.

DETAILED DESCRIPTION

Figure 1:
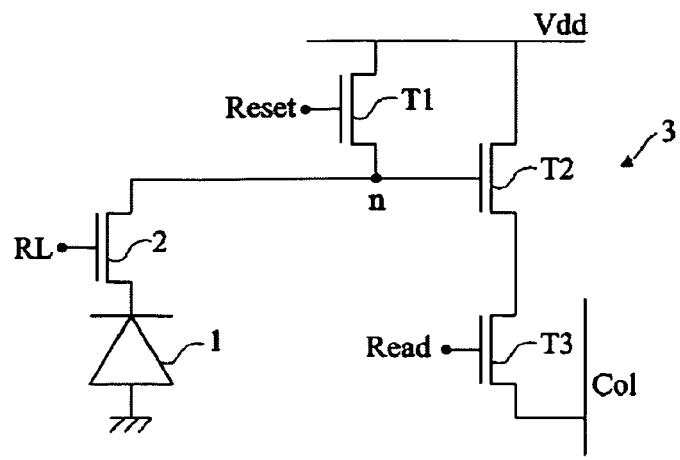
FIG. 1 is a diagram, previously described, of a pixel of 4-transistor type.
Figure 2:
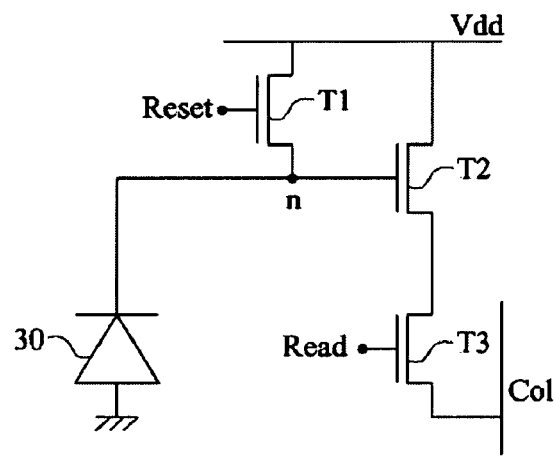
FIG. 2 is an equivalent electric diagram, previously described, of a pixel of 3-transistor type.
Figure 3:
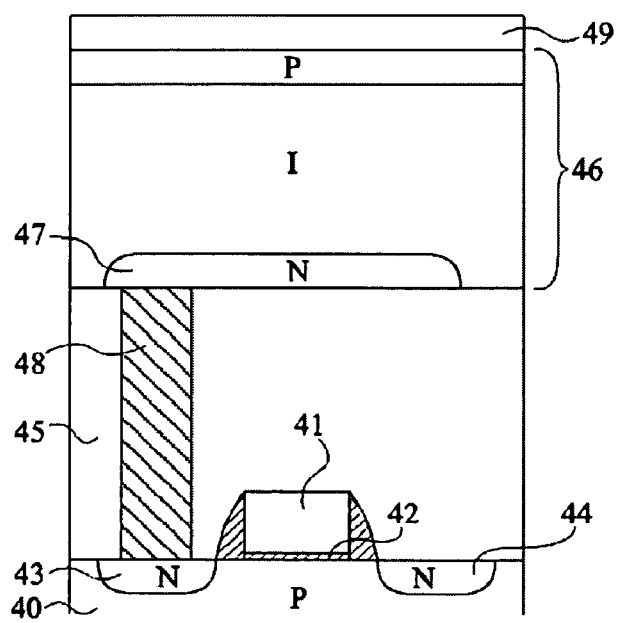
FIG. 3 is a cross-section view, previously described, of a portion of a "compact" pixel of 3-transistor type.

For clarity, the same elements have been designated with the same reference numerals in the different drawings and, further, as usual in the representation of integrated circuits, FIGS. 1, 3, 4, and 5 are not drawn to scale.

An image sensor according to the present invention comprises pixels of 4-transistor type, such as described in FIG. 1. The photodiodes and the access transistors of the pixels are formed in a "lower" semiconductor substrate, and the transistors of the read circuit are formed in an "upper" semiconductor substrate. The two substrates are superposed and separated from each other by an insulating layer. The read transistors are thus placed above the photodiodes and the access transistors. Further, the photodiodes receive incident transistors arriving on the lower surface side of the lower substrate, opposite to the insulating layer and to the upper substrate.

Examples of embodiment of an image sensor according to the present invention are described in further detail hereafter.

Figure 4:
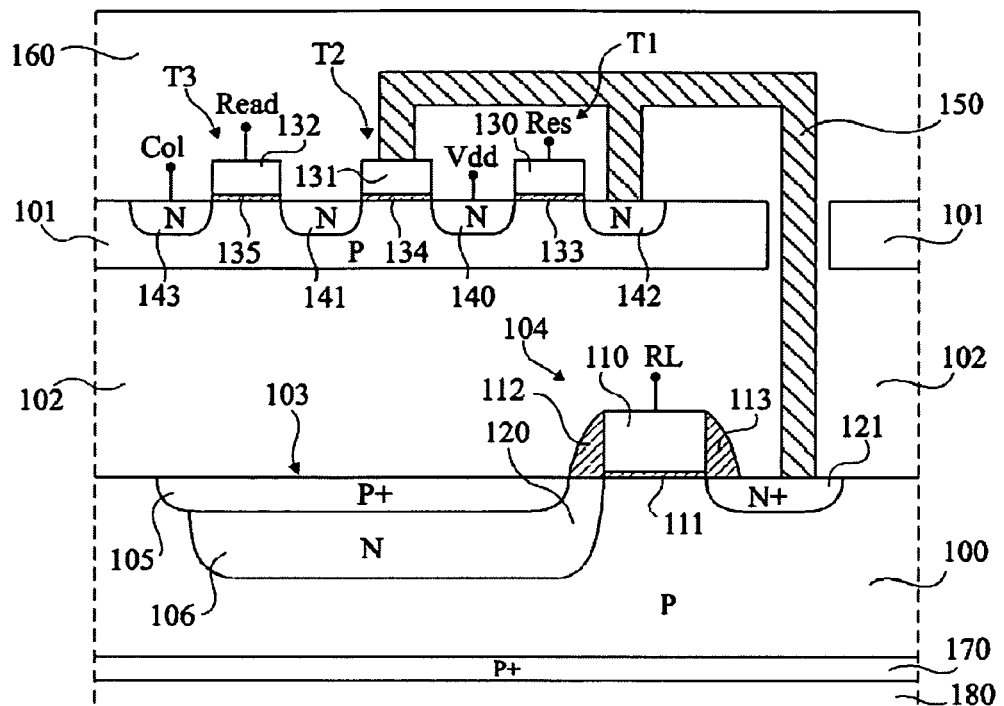
FIG. 4 is a cross-section view of a pixel of an image sensor according to the present invention.

FIG. 4 is a cross-section view of a pixel of a first example of an image sensor according to the present invention. The image sensor comprises a lower semiconductor substrate 100 and an upper semiconductor substrate 101 separated from each other by an intermediary insulating layer 102. The two substrates are P-type doped and intended to be connected to ground GND. Each pixel comprises a photodiode 103 and an access transistor 104 formed in and above lower substrate 100, as well as 3 read transistors T1, T2, and T3 formed in and above upper substrate 101. Photodiode 103 comprises a heavily-doped P-type area 105 placed at the surface of lower substrate 100, and an N-type doped buried area 106 placed under $P^+$ area 105. Access transistor 104 comprises a gate 110 placed above lower substrate 100 and insulated therefrom by a thin insulating layer 111. Insulating spacers 112, 113 are placed against the sides of gate 110. The photodiode is in this example is placed to the left of access transistor 104. $P^+$ area 105 extends to the right to reach insulating spacer 112, without extending under the latter. $P^+$ area 5 is, on its left-hand portion, in contact with substrate 100 and is connected to a ground line GND. N buried layer 106 extends in a source/drain area 120 placed under insulating spacer 112, to the right of $P^+$ area 105. A heavily-doped N-type source/drain area 121 is placed on the other side of gate 110 at the surface of lower surface 100. Transistors T1, T2, and T3 each comprise a gate 130, 131, and 132 placed above upper substrate 101 and insulated from it by a thin insulating layer 133, 134, 135. Heavily-doped N-type source/drain areas are formed at the surface of upper substrate 101 on either side of gates 130 to 132 of transistors T1 to T3. Transistors T1 and T2 have a common source/drain area 140 intended to be connected to supply voltage Vdd. Transistors T2 and T3 have a common source/drain area 141. Transistor T1 has another source/drain area 142 intended to be connected to access transistor 104 of the pixel. Transistor T3 has another source/drain area 143 intended to be connected to a column line Col. Source/drain area 121 of the access transistor formed in lower substrate 100 is connected to source/drain area 142 of transistor T1 and to the gate of transistor T2 by a metallization 150 comprising a portion placed in an opening of insulating layer 102, a portion placed in an opening of an insulating portion placed in an opening of upper substrate 101, and a portion placed in openings of an insulating layer 160 covering upper substrate 101 and transistors T1 to T3.

Although not shown, the row lines RL connected to the access transistors of the pixels and the ground lines connected to the substrate and to areas P+ 105 of the pixels may be mainly formed in insulating layer 102 or in insulating layer 160. In this last case, row lines RL are connected to the gates of access transistors 104 and the ground lines connected to $P^+$ areas 105 by metallizations crossing upper substrate 101 and insulating layer 102 identically to metallizations 150 connecting the access transistors to the read transistors.

The photodiode and the access transistor of each pixel are preferably formed in integrated fashion in a same substrate, that is, such that a source/drain area of the access transistor is an extension of the cathode area of the photodiode. Further, the thickness and the doping of N buried layer 106 are preferably provided so that N buried area 106 is totally depleted at the thermal balance, outside of the phases of capture of incident photons. Under such conditions, the voltage drop across the photodiode exhibits a maximum value set by the concentrations in dopant elements of $P^+$ area 105, of N buried area 106, and of substrate 100. Such a feature enables getting rid of noise such as observed in a 3-transistor type pixel described previously.

According to an aspect of an image sensor according to the present invention, the incident photons detected by the photodiodes arrive on the lower surface side of substrate 100. Lower substrate 100 is sufficiently thin, for example, a few microns, so that the photons reach the photodiode level.

An advantage of an image sensor according to the present invention in which light rays directly arrive at the level of the photodiodes is that, conversely to conventional image sensors, light rays do not undergo parasitic reflection at the level of multiple separation surfaces placed above the substrate and are not reflected by metallizations or other components of the image sensor placed above the substrate.

Further, the electrons of the electron-hole pairs generated in the substrate close to N buried area 106, on arrival of photons, are collected by the photodiode and stored in N buried area 106. The substrate portion placed under the gate of the access transistor gate being located close to N buried area 106, the capture surface of a pixel photodiode substantially corresponds to the entire surface of the lower substrate dedicated to this pixel.

An advantage of a pixel of an image sensor according to the present invention is that the surface area taken up by its photodiode is close to the surface area dedicated to each pixel.

The 2 cumulated above-mentioned advantages provide pixels exhibiting a very high sensitivity.

Further, to further increase the sensitivity of an image sensor according to the present invention, a heavily-doped P-type area 170 at the level of the lower surface of lower substrate 100 must be provided to avoid for electron-hole pairs to recombine at the level of the lower surface of lower substrate 100. $P^+$ area 170 further favors the migration of electrons towards the capture area of the photodiode.

Further, as conventional for image sensors, filter portions 180, letting through incident photons exhibiting wavelengths in the green, blue, or red range, may be placed against $P^+$ area 170 on the lower surface of lower substrate 100.

Further, the pixel matrix of an image sensor is generally connected to a control circuit comprising, among other things, a read device, a device for selecting pixels rows, and bias means. The control circuit and the pixel matrix may be formed in monolithic or "integrated" form. In this case, the semiconductor components of the control circuit may be formed in semiconductor substrate 100 or in semiconductor substrate 101.

An image sensor comprising pixels such as that shown in FIG. 4 may be obtained according to the following manufacturing method.

The access transistors and the photodiodes are first formed above a lower substrate. For this purpose, insulated gates 110, 111 of the access transistors are formed. An ion implantation of N-type dopant elements is performed to form N buried areas 106 of the photodiodes. Insulating spacers 112, 113 are formed against the gate sides according to a conventional method. An ion implantation of P-type dopant elements is then performed to form at the surface of the lower substrate heavily-doped P-type areas 105. An ion implantation of N-type dopant elements is then performed to form at the substrate surface heavily-doped N-type source/drain areas 121.

The lower substrate and the access transistors are then covered with an insulating layer on which a semiconductor layer is deposited to form an upper substrate. The upper substrate may be obtained by a deposition of a semiconductor bonding layer, for example made of silicon, on the intermediary insulating layer, then by "epitaxial" growth of a semiconductor layer on this bonding layer in an epitaxy furnace.

The read transistors are then conventionally formed in and above the upper substrate. Finally, the upper substrate and the read transistors are covered with an "upper" insulating layer.

The metallizations connecting the access transistors and the read transistor may be formed in various ways. One way comprises, after the previously-described steps, forming openings in the upper insulating layer, in the upper substrate, and in the intermediary insulating layer separating the two substrates, and of filling them with a conductive material. Another way comprises, after each step of forming of the intermediary insulating layer, of the second substrate, and of the upper insulating layer, forming openings and filling them with a conductive material.

It should be noted that at the upper substrate level, the metallizations should be surrounded with insulating portions to avoid short-circuiting the substrate and the metallizations.

Once the upper insulating layer has been deposited, the lower substrate may be thinned down, for example, according to a chem./mech. polishing method. A heavily-doped P-type area is then formed by ion implantation on the lower surface side of the lower substrate, after which a deposition of filters according to a conventional method is performed.

Figure 5:
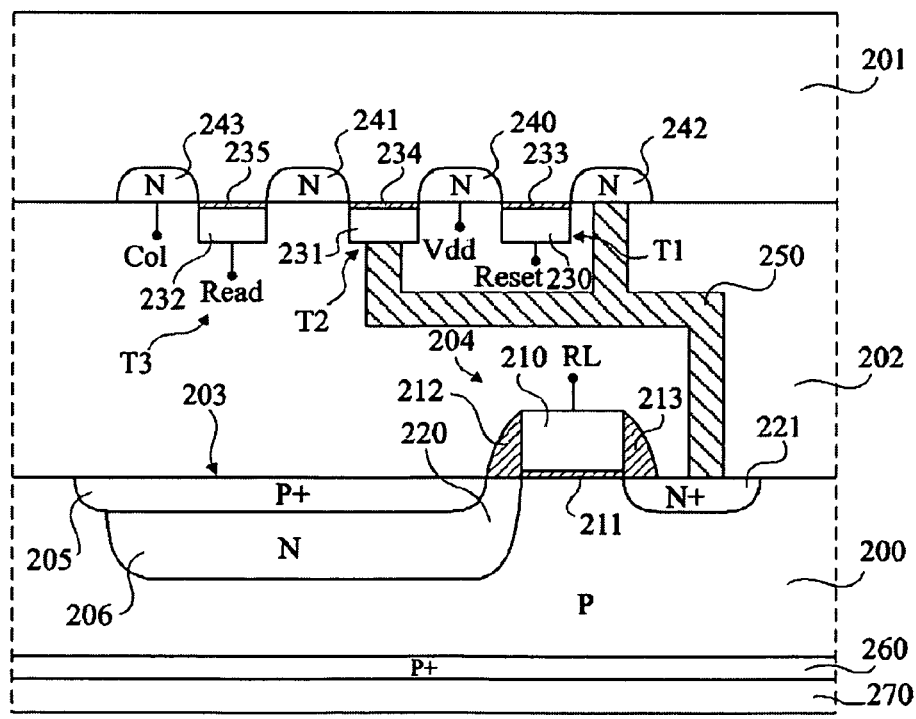
FIG. 5 is a cross-section view of a pixel of another image sensor according to the present invention.

FIG. 5 is a cross-section view of a pixel of another example of an image sensor according to the present invention. This image sensor comprises a lower substrate 200 and an upper substrate 201 separated by an intermediary insulating layer 202. The two substrates are P-type doped and intended to be connected to ground GND. Each pixel comprises a photodiode 203 and an access transistor 204 placed in and above lower substrate 200. Photodiode 203 comprises a heavily-doped P-type area 205 placed at the surface of lower substrate 200. An N-type buried layer 206 is placed under P+ area 205. The access transistor comprises a gate 210 placed under lower substrate 200 and insulated therefrom by a thin insulating layer 211. Insulating spacers 212 and 213 are placed against the sides of gate 210. Photodiode 203 is in this example placed to the left of access transistor 204. P+ area 205 extends rightwards up to left-hand spacer 212 of access transistor 204. N buried area 206 extends in a source/drain area 220 placed under insulating spacer 212, against P+ area 205. P+ area 205 is, on its left-hand portion, in contact with substrate 100 and is connected to a ground line GND. The access transistor comprises another heavily-doped N-type source/drain area 221 placed on the other side of gate 210 at the surface of lower substrate 200. Read transistors T1, T2, and T3 are formed in and under upper substrate 201, that is, "head upside down", on the side of intermediary insulating layer 202. Transistors T1 to T3 each comprise a gate 230, 231, and 232 insulated from upper substrate 201 by a thin insulating layer 233, 234, and 235. Source/drain areas are formed on either side of the gates of transistors T1 to T3. Transistors T1 and T2 have a common source/drain area 240 intended to be connected to a supply line Vdd. Transistors T2 and T3 have a common source/drain area 241. Transistor T1 has another source/drain area 242 intended to be connected to access transistor 204. Transistor T3 has another source/drain area 243 intended to be connected to a column line Col. The gates of transistors T1 and T3 are respectively intended to be connected to a reset signal and to a read signal. A metallization 250 connecting drain/drain area 221 of the access transistor to drain/drain area 242 of transistor T1 and to the gate of transistor T2 is placed in an opening of intermediary insulating layer 202. Similarly, although not shown, ground, supply, column, row lines GND, Vdd, Col, RL, and lines supporting reset and read signals Reset and Read are placed in intermediary insulating layer 202. A heavily-doped P-type area 260 is formed at the surface of lower substrate 200 on its lower surface side. Filter portions 270 are placed against the lower surface of lower substrate 200.

Although not shown, metal contacts ensuring the connection between the outside of the circuit and the elements of the image sensor placed in the substrates or in intermediary insulating layer 202 may be placed in insulated openings of upper substrate 201 to be accessible on the upper surface side of substrate 201.

The advantages of this image sensor are the same as those previously described for the image sensor shown in FIG. 4.

Such an image sensor can be obtained according to the following method.

According to a method identical to that used to form the image sensor shown in FIG. 4, photodiodes and access transistors are formed in and above a first substrate. This first substrate and the access transistors are covered with an insulating layer. Further, read transistors are formed in and above a second substrate, according to a conventional method. This second substrate and the read transistors are then covered with an insulating layer. A gluing of the two insulating layers covering the first and second substrates is then performed. The first substrate, considered as the lower substrate, is then thinned down, for example, according to a chem./mech. polishing method. A heavily-doped area is then formed by ion implantation on the lower surface side of the lower substrate and this same surface is covered with filters according to a standard method. The metallizations connecting the access transistors to the read transistors may be formed of two portions, each formed prior to the gluing of the two insulating layers by forming metal portions in openings of the insulating layers. Similarly, ground, supply, column, row lines GND, Vdd, Col, RL, and the lines supporting the reset and read signals may be formed in one of the insulating layers or partly in each of the insulating layers prior to the gluing of the two insulating layers.

Of course, the present invention is likely to have various alterations, modifications, and improvements which will readily occur to those skilled in the art. In particular, microlenses may be placed on the filters on the lower surface side of the lower substrate of an image sensor according to the present invention to focus the incident rays at the photodiode level.

Further, it may be chosen to place one or several transistors of the read circuit at the level of the lower substrate hosting the photodiodes and the access transistors.

Moreover, the read transistors placed in the upper substrate may be shared by several pixels.

Further, those skilled in the art may devise other structures and other methods for manufacturing an image sensor according to the present invention.

Moreover, although the previously-described image sensors comprise MOS-type transistors, an image sensor according to the present invention may be formed with transistors of another type, such as JFET transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising a pixel assembly, each pixel comprising a photodiode and an insulated gate access transistor connected to a read circuit, wherein:
   the photodiode and the access transistor are formed in and above a first semiconductor substrate;
   all or part of the read circuit is formed in a second semiconductor substrate;
   the second substrate is placed above the first substrate and separated therefrom by an intermediary insulating layer covering the insulated gate access transistor;
   the photodiode receives incident photons arriving in the first semiconductor substrate on its lower surface side opposite to said intermediary insulating layer and comprises a heavily-doped P-type upper area placed at the surface of the first substrate and an N-type buried layer placed under the P-type upper area, said buried layer extending in a source/drain area of the access transistor, and another source/drain area of the access transistor being placed on the other side of its gate at the surface of the first substrate.

2. The image sensor of claim 1, wherein the heavily-doped P-type upper area is connected to a bias voltage such as a ground via, among others, a metallization placed in the intermediary insulating layer above the heavily-doped P-type upper area.

3. The image sensor of claim 1, wherein the read circuit comprises read transistors formed on the upper surface side of the second substrate, the second substrate and the read transistors being covered with an upper insulating layer, and a metallization, connecting the access transistor and the read circuit, being placed partly in openings of the intermediary insulating layer, partly in openings insulated from the second substrate, and partly in openings of the upper insulating layer.

4. The image sensor of claim 1, wherein the read circuit comprises read transistors formed on the lower surface side of the second substrate, the read transistors being covered with said intermediary insulating layer, and a metallization, connecting the access transistor and the read circuit, being placed in said intermediary insulating layer.

5. The image sensor of claim 1, comprising for each pixel a filter portion placed against the lower surface side of the first substrate.

6. The image sensor of claim 5, comprising for each pixel a lens placed against the filter portion.

7. The image sensor of claim 1, wherein a heavily-doped P-type area is formed at the surface of the first substrate on its lower surface side.

8. The image sensor of claim 2, wherein a thickness and a doping of the N-type buried layer of the photodiode are such that without any photon capture, the N-type buried layer is entirely depleted.

9. The image sensor of claim 1, comprising a control circuit having its semiconductor components formed in the first semiconductor substrate.

10. The image sensor of claim 5, wherein the filter portion is configured to allow transmission of the incident photons exhibiting at least one wavelength within a plurality of predefined wavelengths.

11. The image sensor of claim 1, wherein a plurality of read lines are formed in the intermediary insulating layer.

12. The image sensor of claim 11, wherein at least one of the plurality of read lines is connected to the insulated gate access transistor.

13. The image sensor of claim 1, wherein the read circuit receives a reset signal to reset the read circuit.

14. The image sensor of claim 1, wherein an upper insulating layer is formed above the second semiconductor substrate and the upper insulating layer covers part of the read circuit.

15. The image sensor of claim 14, wherein at least one metal contact is placed on the upper surface side of the upper insulating layer.

16. The image sensor of claim 14, wherein at least one metal contact is placed in at least one insulated opening of the upper insulating layer.

17. An image sensor comprising a pixel assembly of at least one pixel, the at least one pixel comprising a photodiode and an insulated gate access transistor connected to a read circuit, wherein:
   the photodiode and the insulated gate access transistor are formed in and above a first semiconductor substrate;
   all or part of the read circuit is formed in a second semiconductor substrate;
   the second semiconductor substrate is placed above the first substrate and separated from the first substrate by an intermediary insulating layer covering the insulated gate access transistor;
   the photodiode receives incident photons arriving in the first semiconductor substrate on its lower surface side opposite to said intermediary insulating layer; and
   a heavily-doped P-type area is formed at the surface of the first substrate on its lower surface side.

18. An image sensor, comprising:
   a pixel assembly, each pixel of the pixel assembly comprising at least one photodiode, at least one insulated gate access transistor connected to the at least one photodiode and a read circuit, the read circuit comprising at least one read transistor;
   a metallization connecting the at least one insulated gate access transistor to the read circuit;
   a first insulating layer located above a first semiconductor substrate;
   a second insulating layer located above a second semiconductor substrate and the first insulating layer;
   wherein the at least one photodiode and the at least one insulated gate access transistor are formed in and above the first semiconductor substrate;
   wherein the at least one photodiode comprises a first heavily-doped P-type upper area placed at an upper surface of the first semiconductor substrate and an N-type buried layer placed under the first heavily-doped P-type upper area;
   wherein at least one part of the read circuit is formed in the second semiconductor substrate;
   a second heavily-doped P-type area is placed at a lower surface side of the first semiconductor substrate; and
   the at least one photodiode receives at least one incident photon on the lower surface side of the first semiconductor substrate.

* * * * *